US012622253B2

(12) United States Patent
Do et al.

(10) Patent No.: US 12,622,253 B2
(45) Date of Patent: May 5, 2026

(54) SEMICONDUCTOR DEVICE WITH THROUGH VIAS OF VARIOUS SHAPES AND METHOD OF MANUFACTURING THE SAME

(71) Applicant: SK hynix Inc., Icheon-si (KR)

(72) Inventors: Eun Hye Do, Icheon-si (KR); Jong Hoon Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 339 days.

(21) Appl. No.: 18/335,868

(22) Filed: Jun. 15, 2023

(65) Prior Publication Data

US 2024/0258201 A1 Aug. 1, 2024

(30) Foreign Application Priority Data

Jan. 31, 2023 (KR) ........................ 10-2023-0013137

(51) Int. Cl.
| | |
|---|---|
| *H01L 23/48* | (2006.01) |
| *H01L 21/768* | (2006.01) |
| *H01L 23/00* | (2006.01) |

(52) U.S. Cl.
CPC ...... *H01L 23/481* (2013.01); *H01L 21/76898* (2013.01); *H01L 24/11* (2013.01); *H01L 24/13* (2013.01); *H01L 24/16* (2013.01); *H01L 2224/1146* (2013.01); *H01L 2224/13147* (2013.01); *H01L 2224/16145* (2013.01)

(58) Field of Classification Search
CPC ....... H01L 23/481; H01L 2225/06541–06544; H01L 2225/06548
See application file for complete search history.

(56) References Cited

U.S. PATENT DOCUMENTS

| | | | | |
|---|---|---|---|---|
| 7,973,416 B2 * | 7/2011 | Chauhan | ................. | H01L 24/81 |
| | | | | 257/777 |
| 8,053,902 B2 * | 11/2011 | Chen | ..................... | H01L 23/481 |
| | | | | 257/776 |
| 8,368,202 B2 * | 2/2013 | Chiu | ........................ | H01L 24/05 |
| | | | | 257/E23.021 |
| 8,456,015 B2 * | 6/2013 | Trezza | .................... | H01L 25/50 |
| | | | | 257/774 |
| 9,318,376 B1 * | 4/2016 | Holm | .................. | B81C 1/00095 |
| 2005/0121768 A1 * | 6/2005 | Edelstein | .......... | H01L 23/49827 |
| | | | | 257/E23.067 |
| 2005/0218497 A1 * | 10/2005 | Komuro | .................. | H01L 24/05 |
| | | | | 257/E23.008 |
| 2006/0001174 A1 * | 1/2006 | Matsui | ................ | H01L 25/0657 |
| | | | | 257/E23.079 |

(Continued)

FOREIGN PATENT DOCUMENTS

| | | | | | |
|---|---|---|---|---|---|
| CN | 103681573 A | * | 3/2014 | ........... | H01L 23/481 |
| CN | 107046010 A | * | 8/2017 | ........... | H01L 23/367 |

(Continued)

*Primary Examiner* — Scott B Geyer
(74) *Attorney, Agent, or Firm* — WILLIAM PARK AND ASSOCIATES LTD.

(57) ABSTRACT

A semiconductor device is provided with differently-shaped conductive through-vias, having different-shape horizontal cross-sections. The cross-sectional shapes of the via include but are not limited to circular and ring shaped, which are cross sections that correspond to vias that are pillar shaped and tube-shaped respectively.

18 Claims, 22 Drawing Sheets

(56) References Cited

U.S. PATENT DOCUMENTS

| | | | | | |
|---|---|---|---|---|---|
| 2009/0256258 | A1* | 10/2009 | Kreupl | .............. | H01L 21/6835 |
| | | | | | 438/675 |
| 2010/0308435 | A1* | 12/2010 | Nowak | ................ | H01L 23/481 |
| | | | | | 257/532 |
| 2011/0031633 | A1* | 2/2011 | Hsu | ........................ | H01L 25/50 |
| | | | | | 257/E21.585 |
| 2011/0079920 | A1* | 4/2011 | Chaabouni | ........... | H01L 23/481 |
| | | | | | 438/597 |
| 2011/0095435 | A1* | 4/2011 | Volant | .................. | H01L 23/481 |
| | | | | | 257/E21.597 |
| 2011/0291267 | A1* | 12/2011 | Wang | ................. | H01L 25/0657 |
| | | | | | 257/737 |
| 2011/0291268 | A1* | 12/2011 | Wang | ................. | H01L 25/0657 |
| | | | | | 257/737 |
| 2013/0082385 | A1* | 4/2013 | Kirkpatrick | ....... | H01L 23/53295 |
| | | | | | 438/643 |
| 2013/0127019 | A1* | 5/2013 | Lee | ..................... | H01L 23/481 |
| | | | | | 257/E23.141 |
| 2014/0103540 | A1* | 4/2014 | Ching | .............. | H01L 23/49827 |
| | | | | | 438/109 |
| 2014/0151895 | A1* | 6/2014 | West | .................... | H01L 23/481 |
| | | | | | 257/774 |
| 2015/0028450 | A1* | 1/2015 | Park | ................. | H01L 21/76898 |
| | | | | | 257/532 |
| 2015/0137387 | A1* | 5/2015 | Choi | ................... | H01L 25/0657 |
| | | | | | 257/774 |
| 2016/0020145 | A1* | 1/2016 | Lee | ..................... | H01L 21/3083 |
| | | | | | 438/618 |
| 2016/0293487 | A1* | 10/2016 | Farooq | ............. | H01L 21/76898 |
| 2017/0025384 | A1* | 1/2017 | Park | ..................... | H01L 23/481 |
| 2017/0040255 | A1* | 2/2017 | Lee | ..................... | H01L 23/498 |
| 2017/0287781 | A1* | 10/2017 | Karnik | ................. | H01L 23/528 |
| 2021/0005534 | A1* | 1/2021 | Sidorov | ........... | H01L 21/76802 |
| 2021/0020543 | A1* | 1/2021 | Lee | .................. | H01L 21/76898 |
| 2023/0178470 | A1* | 6/2023 | Lee | ......................... | H01L 21/56 |
| 2024/0088006 | A1* | 3/2024 | Park | ..................... | H01L 23/481 |
| 2024/0297099 | A1* | 9/2024 | Gambino | ........... | H10F 39/8053 |

FOREIGN PATENT DOCUMENTS

| | | | | | | |
|---|---|---|---|---|---|---|
| CN | 110718520 | A | * | 1/2020 | ........... | H01L 23/481 |
| CN | 110911370 | A | * | 3/2020 | ........... | H01L 23/481 |
| KR | 20110119290 | A | * | 11/2011 | ........... | H01L 23/481 |
| KR | 20120034518 | A | * | 4/2012 | ....... | H01L 21/76897 |
| KR | 20120104638 | A | * | 9/2012 | ............. | H01L 21/28 |
| KR | 20130085148 | A | * | 7/2013 | ......... | H01L 23/5329 |
| KR | 20160015115 | A | * | 2/2016 | ......... | H01L 25/0657 |

* cited by examiner

SEMICONDUCTOR DEVICE WITH THROUGH VIAS OF VARIOUS SHAPES AND METHOD OF MANUFACTURING THE SAME

CROSS-REFERENCE TO RELATED APPLICATIONS

The present application claims priority under 35 U.S.C. 119(a) to Korean Application No. 10-2023-0013137, filed on Jan. 31, 2023, in the Korean Intellectual Property Office, which is incorporated herein by reference in its entirety.

BACKGROUND

1. Technical Field

The present disclosure generally relates to a semiconductor technology and, more particularly, to a semiconductor device with through vias of various different shapes and a method of manufacturing the same.

2. Related Art

A semiconductor device may include through-vias that penetrate a substrate. Integrated circuits may be integrated on or in, the substrate. When a through-via is filled or its interior surface is coated with an electrically-conductive material, a through-via provides a means of transferring signals and power to and between integrated circuits formed "on" or "in" the substrate. Different vias might help to improve semiconductor device performance, integration density, and operating speed increase.

SUMMARY

The present disclosure according to an aspect may provide a semiconductor device including a substrate, and a first through via and a second through via which penetrate the substrate. The first through via may be a pillar; the second through via may be a tube.

The present disclosure according to an aspect may provide a method of manufacturing a semiconductor device including forming a first hole and a second hole from a first surface of a substrate, and forming first and second through vias filling the first hole and the second hole, respectively. The first hole may be formed as a first hole of a pillar shape, and the second hole may be formed as a second hole of a tube shape.

BRIEF DESCRIPTION OF THE DRAWINGS

FIGS. 5 and 6 are schematic views illustrating a semiconductor device according to an embodiment.

FIGS. 9 to 17 are schematic views illustrating steps of a method of manufacturing a semiconductor device according to an embodiment of the present disclosure.

FIGS. 18 to 22 are schematic views illustrating steps of a method of manufacturing a semiconductor device according to an embodiment of the present disclosure.

DETAILED DESCRIPTION

Figure 1:
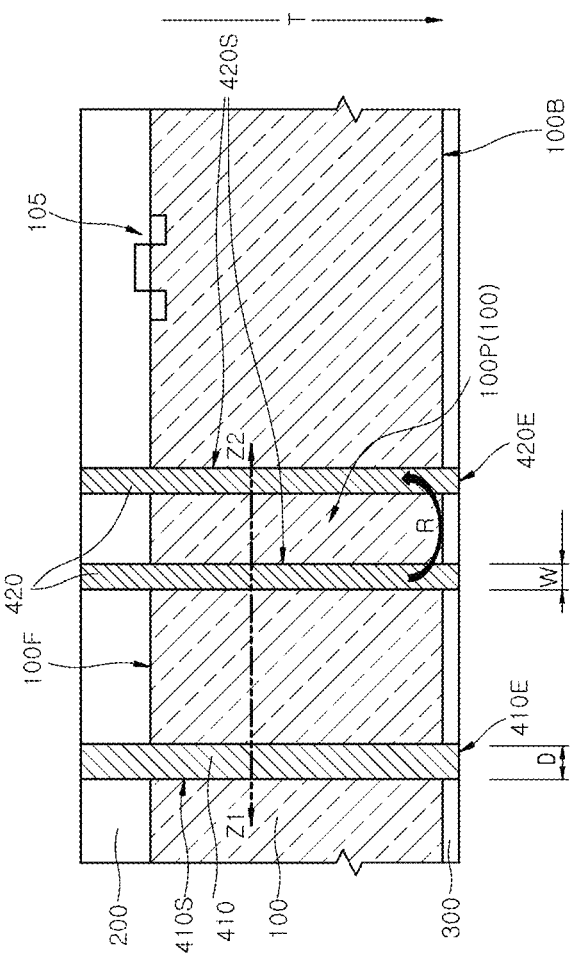
FIGS. 1 and 2 are schematic views illustrating a semiconductor device according to an embodiment.

Unless they are specifically defined otherwise, terms used herein, (including technical and scientific terms) have their common and ordinary meanings.

It will be understood that although the terms "first," "second," "side," "top or upper," and "bottom or lower" are relative terms that may be used herein to describe various devices. Such devices should not be limited by such terms because they are only used to distinguish one device or structure from another device or structure, not to indicate a particular or required sequence or number of devices or structures.

As used herein and for claim construction purposes, "penetrate" means passing, extending, piercing, or diffusing, into or through something. A pillar is a solid, right-circular cylinder having two, substantially circular and substantially parallel bases and a center axis that joins the centers of the two bases substantially perpendicular to the planes of the two bases. A tube is a hollow, right-circular cylinder comprising a wall with a thickness, substantially parallel bases and a center axis substantially orthogonal to the bases. A ring, also known as an annulus, is a plane or flat figure comprised of two, substantially concentric circles of different diameters. The distance between the two circles is considered the section width of the ring/annulus. The shape of a tube's horizontal cross section is a ring or annulus. A hole, which may be circular or tube-shaped is a correspondingly-shaped unfilled space or volume.

Cross sections can be either horizontal or vertical. A horizontal cross section cuts through an object in a horizontal direction, i.e., in a direction parallel to the object's base. A vertical cross section cuts through an object the vertical direction. i.e., in a direction perpendicular to the object's base.

A semiconductor device may comprise a semiconductor substrate or a structure comprised of a plurality of stacked semiconductor substrates. The semiconductor device may comprise a semiconductor package structure in which semiconductor substrates are packaged. The semiconductor substrate may be a semiconductor wafer, a semiconductor die, or a semiconductor chip in which electronic components and devices are integrated. Integrated circuits may be integrated or formed "on" or "in" a semiconductor substrate. A semiconductor substrate may be divided into a plurality of semiconductor chips or a plurality of semiconductor dies.

The semiconductor chip may be a memory chip in which memory devices such as dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits, or phase change random access memory (PcRAM) are integrated. The semiconductor chips may refer to logic dies or ASIC chips in which logic circuits are integrated in a semiconductor substrate, or processor such as application processors (Aps), graphic processing units (GPUs), central processing units (CPUs) or system-on-chips (SoCs).

The semiconductor chips may be elements constituting a semiconductor package or a semiconductor product. The semiconductor chip may be employed in information communication systems such as mobile phones, electronic systems associated with biotechnology or health care, or wearable electronic systems. The semiconductor chips may be applicable to internet of things (IoT).

Figure 2:
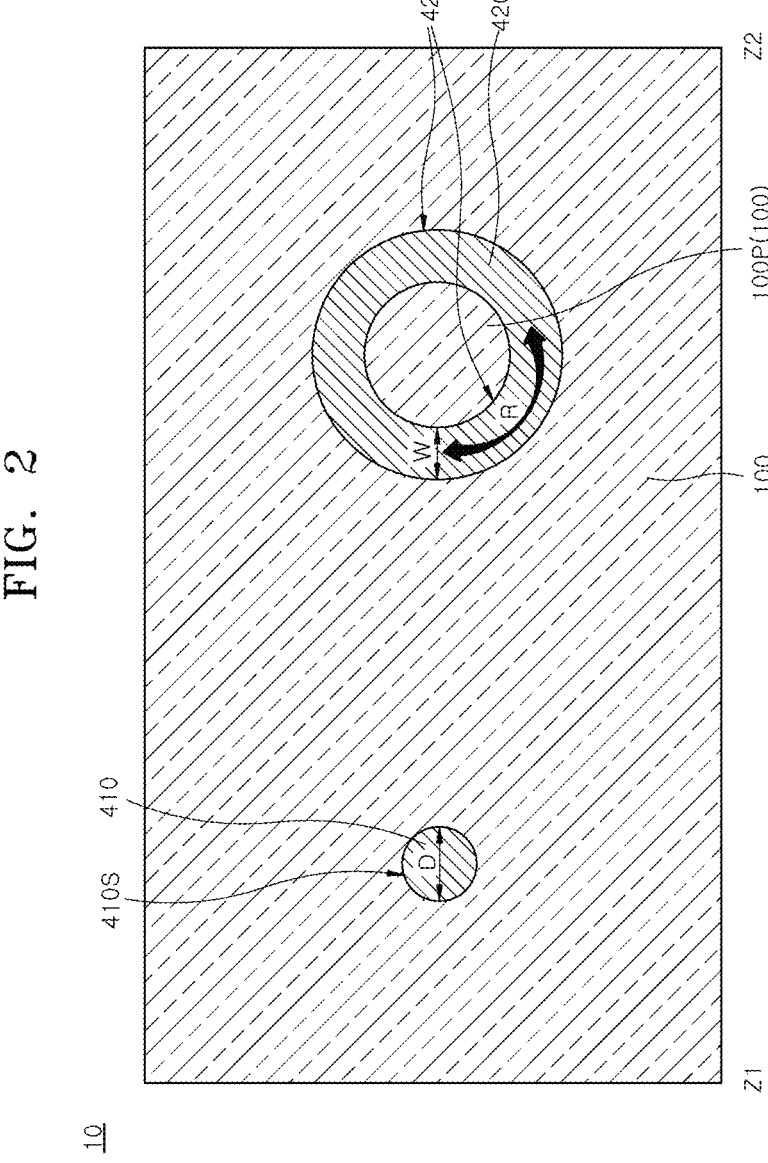

FIG. 1 is a schematic vertical cross-sectional view illustrating a semiconductor device 10 according to an embodiment. FIG. 2 is a schematic horizontal cross-sectional view illustrating a horizontal cross-section of the semiconductor device 10 taken along the line Z1-Z2 of FIG. 1.

Referring to FIGS. 1 and 2, the semiconductor device 10 may include a substrate 100, a first through via 410, and a second through via 420. The first through via 410 and the second through via 420 may each be formed to have various shapes. In the following descriptions, descriptions such as "first", "second", and "third" should be understood as descriptions for distinguishing elements, and not descriptions referring to a particular order.

The substrate 100 may be a semiconductor substrate including a semiconductor material. The semiconductor material constituting the substrate 100 may include silicon (Si). The substrate 100 may include germanium (Ge). Alternatively, the substrate 100 may be a substrate including silicon carbide (SiC). The substrate 100 may include a compound semiconductor material such as gallium arsenide (GaAs), indium arsenide (InAs), or indium phosphide (InP). The substrate 100 may have a silicon on insulator (SOI) structure. Although not illustrated, the substrate 100 may include an impurity layer structure doped with impurities or a well structure doped with impurities. The substrate 100 may have a first surface 100F and a second surface 100B, and the second surface 100B may be opposite to the first surface 100F. The first surface 100F of the substrate 100 may be a front side, and the second surface 100B may be a back side.

The semiconductor device 10 may further include integrated circuit elements 105 formed "on" or "in" the first surface 100F of the substrate 100. The integrated circuit elements 105 may be formed to constitute integrated circuits to be integrated on or in the substrate 100. Such integrated circuit elements may include transistors, capacitors, diodes, or the like. The integrated circuits may include volatile memory devices such as DRAM devices. The integrated circuits may include nonvolatile memory devices such as NAND devices.

The first through via 410 and the second through via 420 may each include a conductive layer, a conductive pattern, or a conductive element that penetrates the substrate 100. Although not illustrated, the first through via 410 and the second through via 420 may each include an insulating layer or a buffer layer that electrically isolates the conductive layer (conductive pattern, or conductive element) from the substrate 100. The conductive layers constituting the first through via 410 and the second through via 420 may include substantially the same conductive material. The conductive material may include a metal material such as copper (Cu). The insulating material constituting each of the first through via 410 and the second through via 420 may include silicon dioxide (SiO$_2$).

The first through via 410 and the second through via 420 may be formed to extend through the substrate 100 from the first surface 100F to the second surface 100B of the substrate 100 and thus penetrate the substrate 100. Each of the first through via 410 and the second through via 420 may have a length extending through the substrate 100 along the direction "T" i.e., from the first surface 100F of the substrate 100 to the second surface 100B. The first through via 410 and the second through via 420 may each be completely filled or partially filled with an electrically-conductive material, or their interior surfaces may be coated with an electrically conductive material to provide an electrical interconnection between the first surface 100F and the second surface 1B as well as between any other intermediate layers that may be formed between the first and second exterior substrate surfaces. The first through via 410 and the second through via 420 may thus be formed to provide a an electrically-conductive through silicon via (TSV) structure or a through substrate via structure.

The semiconductor device 10 may further include a first dielectric layer 200 covering the first surface 100F of the substrate 100. The first dielectric layer 200 may comprise an insulating layer covering the integrated circuit elements 105. The first dielectric layer 200 may include silicon dioxide (SiO$_2$), silicon nitride (Si$_3$N$_4$), or silicon oxynitride (SiON). The first dielectric layer 200 may include a plurality of layers including silicon dioxide (SiO$_2$), silicon nitride (Si$_3$N$_4$), or silicon oxynitride (SiON). The first dielectric layer 200 may include a low dielectric constant material having a low dielectric constant K of about 2.0 to 2.6. The low dielectric constant material may include SiOC or SiCOH. The first through via 410 and the second through via 420 may further extend to substantially penetrate the first dielectric layer 200.

The semiconductor device 10 may further comprise a protection layer 300 covering the second surface 100B of the substrate 100. The protection layer 300 may include a passivation layer. The protection layer 300 may include silicon dioxide (SiO$_2$), a double layer of silicon dioxide (SiO$_2$) and silicon nitride (Si$_3$N$_4$), or a double layer of silicon dioxide (SiO$_2$) and silicon oxynitride (SiON). The first through via 410 and the second through via 420 may further extend to substantially penetrate the protection layer 300. An end 410E of the first through via 410 and an end 420E of the second through via 420 may be exposed without being covered by the protection layer 300.

The first through via 410 may have a shape, which is the same as, or substantially the same as a pillar, which penetrates the substrate 100 and extends through the surfaces 100F and 100B. As illustrated in FIG. 2, which is a horizontal cross section of the semiconductor device 10 taken along line Z1-Z2, the cross-sectional shape of the first through via 410 may be round or circular because the first through via 410 is pillar-shaped. In an alternate embodiment, the shape of the first pillar may be a triangular pillar, which is a solid right prism having two substantially-identical parallel and triangular bases and three lateral faces, which are parallelograms. In another embodiment, the first pillar may be a polygonal pillar, which is a solid right prism having two substantially-identical parallel and polygonal bases and lateral parallelogram-shaped faces extending between corresponding segments of the polygonal bases.

The second through via 420 may be a tube, that penetrates the substrate 100. As illustrated in the horizontal cross-section taken along the cutting line Z1-Z2, the horizontal cross-section of the second through via 420 may be ring-shaped. The second through via 420 extends through the first surface 100F and through the second surface 100B of the substrate 100. In an alternate embodiment, the second through via 420 may be a triangular tube or a polygonal tube. Because the second through via 420 may be tube-shaped and thus have a ring-shaped horizontal cross-section, a portion 100P of the substrate 100 may fill the interior of the tube-shaped second through via 420. The substrate 100 material within the tube-shaped second through via 420 is thus surrounded by the tube-shaped second through via 420. The portion 100P of the substrate 100 inside the second through via 420 may be considered to be a pillar shaped via formed or inserted into the tube-shaped second through via 420. The second, shaped via is thus surrounded by the tube-shaped second through via 420. As with the alternate embodiment triangular tube and a polygonal tube, the pillar-shaped via 100P of may have various other cross-sectional shapes other than the first pillar shape of the first through via 410.

The first through via 410 and the second through via 420 may be formed so that an area of a first interface 410S between the first through via 410 and the substrate 100 is smaller than an area of a second interface 420S between the second through via 420 and the substrate 100. Because the ring shape of the second through via 420 is extended circumferentially in the direction R, the area of the second interface 420S between the substrate 100 and the second through via 420 may be greater than the area of the first interface 410S between the first through via 410 and the substrate 100. The portion 100P of the substrate 100 is located inside the tube-shaped second through via 420, the horizontal cross-sectional shape of which is substantially a ring. The area of the second interface 420S between the second through via 420 and the substrate 100 may thus be greater than the area of the first interface 410S between the first through via 410 and the substrate 100.

When power, current, or a data signal is transmitted through the first through via 410, a first capacitance may exist between the first through via 410 and the substrate 100. In addition, when power, current, or a data signal is transmitted through the second through via 420, a second capacitance may exist between the second through via 420 and the substrate 100. These first and second capacitances may be referred to parasitic capacitances.

Because the area of the first interface 410S between the first through via 410 and the substrate 100 is smaller than the area of the second interface 420S between the second through via 420 and the substrate 100, the first capacitance may be smaller than the second capacitance. The parasitic capacitance may impede the transmission of signals through the through vias 410 and 420. Data may be transmitted through the first through via 410, with a smaller parasitic capacitance, faster and with less attenuation than data transmitted through the second through via 420. The first through via 410 may thus be used as a path for transmitting data signals to integrated circuit elements 105 formed on or in the substrate 100. Since the area of the second interface 420S is larger than the area of the first interface 410s, the second interface 420S may have a lower D.C. resistance than the first interface 410S. The second through via 420 and its larger second interface 420S may be used to deliver operating power to circuit elements 105 formed on or in the substrate 100.

The first through via 410 may be a pillar or substantially pillar-shaped with a diameter D. As shown in FIG. 2, the second through via 420 may be a tube or substantially tube-shaped, with a horizontal cross section that is ring-shaped, i.e., annular. The ring-shaped cross section of the second through via 420 extends in the circumferential direction R and has a section width, W. The section width W of the annular cross section corresponds to the thickness of the wall of the tube-shaped second through via 420. W is also the section width of the ring-shaped cross section of the tube shown in a horizontal cross-section along the Z1-Z2 cutting line.

The section width, W, of the annular horizontal cross section of the second through via 420, which is also the wall thickness of the tube-shaped via, may be smaller than the diameter, D, of the pillar-shaped first through via 410. Nevertheless, because the second through via 420 is a tube (or substantially tube-shaped), a volume of the second through via 420 may be greater than a volume of the pillar-shaped first through via 410. As shown in the horizontal cross-section along cutting line Z1-Z2, a cross-sectional area of the second through via 420 may be greater than the area of a first cross-sectional area of the first through via 410.

Accordingly, when current flows through the through vias 410 and 420, a second electrical resistance of the second through via 420 may be smaller than a first electrical resistance of the first through via 410. Because the second electrical resistance of the second through via 420 may be smaller than the electrical first resistance of the first through via 410, the second through via 420 may be better-suited to for carrying operating current to integrated circuit elements 105 than the first through via 410. The power distribution network (PDN) characteristics of the semiconductor device 10 may thus be improved by using the second through vias 420 as a power transmission path.

Figure 3:
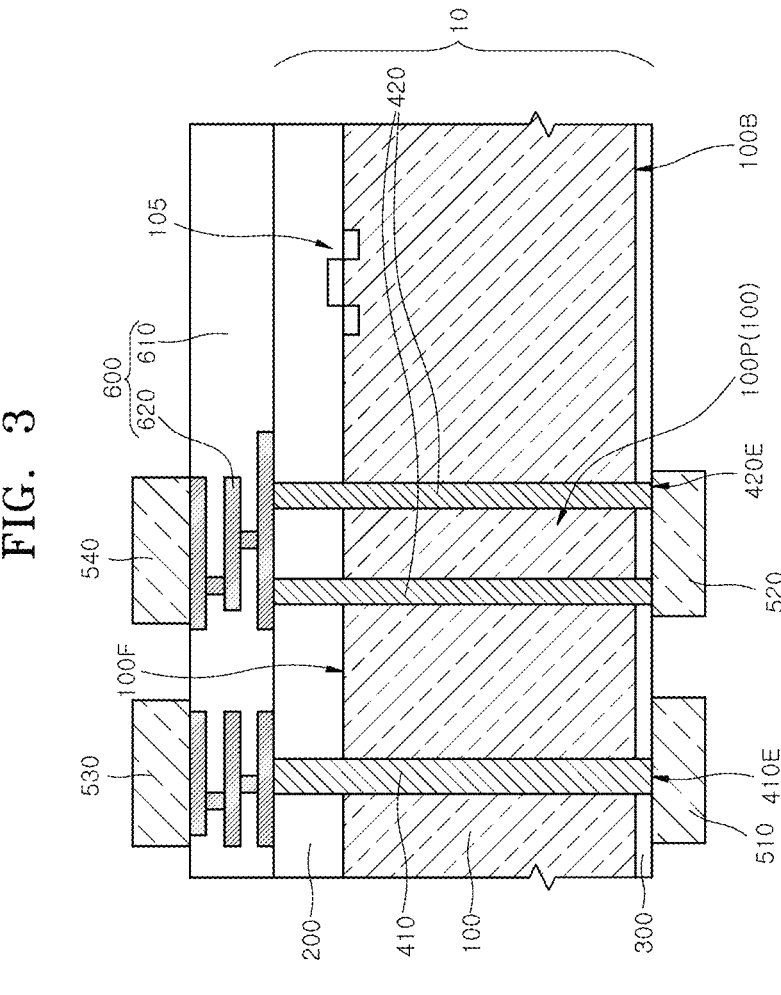
FIGS. 3 and 4 are schematic views illustrating semiconductor devices according to embodiments of the present disclosure.

FIG. 3 is a schematic vertical cross-sectional view illustrating a semiconductor device 11 according to an embodiment of the present disclosure and shows vertical schematic cross-sectional view of first to fourth bumps 510, 520, 530, and 540, connected to the semiconductor device 10 illustrated in FIG. 1.

Referring to FIGS. 1 and 3, the semiconductor device 11 may further include a first bump 510 and a second bump 520. The first bump 510 may be a connector that is positioned over a second surface 100B of a substrate 100 and electrically connected to a first through via 410. The second bump 520 may be a connector that is positioned over the second surface 100B of the substrate 100 and electrically connected to a second through via 420. The second bump 520 may be positioned over the second surface 100B such that a portion 100P of the second pillar-shaped substrate 100, inserted into a first ring shape of the second through via 420 overlaps with the second bump 520. Each of the first and second bumps 510 and 520 may be formed as a conductive pattern, using a metal such as copper (Cu).

The semiconductor device 11 may further include the third bump 530 and the fourth bump 540 over a first surface 100F of the substrate 100. The third bump 530 may be one of a variety of connectors that are opposite to the first bump 510 and electrically connected to the first through via 410. The fourth bump 540 may be one of a variety of connectors that are opposite to the second bump 510 and electrically connected to the second through via 420. The fourth bump 540 may be positioned over the first surface 100F such that the portion 100P of the second pillar-shaped substrate 100, within the tube-shaped second through via 420 is overlapped by the fourth bump 540. Each of the third and fourth bumps 530 and 540 may be formed as a conductive pattern including a metal material such as copper (Cu).

The semiconductor device 11 may further include an interconnection structure 600. The interconnection structure 600 may be positioned between the third bump 530 and the first through via 410. The interconnection structure 600 may also be positioned between the fourth bump 540 and the second through via 420.

The interconnection structure 600 may be formed within a second dielectric layer 610 and include one or more substantially horizontal, electrically-conductive interconnection lines or patterns 620. The interconnection patterns 620 may be configured as part of a multi-layered structure. The interconnection pattern 620 may include a metal material such as aluminum (Al). The second dielectric layer 610, which may be an intermetallic dielectric material, may insulate the interconnection patterns 620 from each other.

The interconnection patterns 620 may electrically connect the third bump 530 to the first through via 410 or electrically connect the fourth bump 540 to the second through via 420. The interconnection patterns 620 may also electrically connect the first through via 410 to an integrated element 105. The interconnection patterns 620 may also electrically connect the second through via 420 to the integrated element 105. Additional interconnection patterns may be formed within the dielectric layer 610, but are omitted from FIG. 3 in the interest of illustration clarity. Such additional interconnection patterns 620 may be used to provide interconnections to an integrated circuit element 105.

Figure 4:
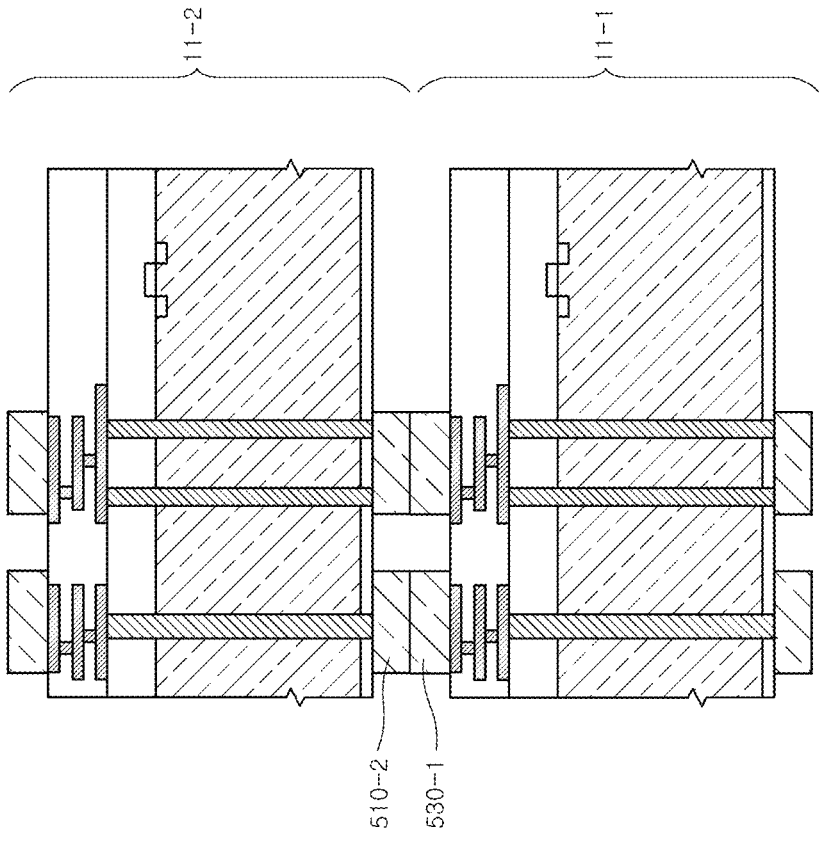

FIG. 4 is a vertical schematic cross-sectional view illustrating a semiconductor device 12 according to an embodiment of the present disclosure. The semiconductor device 12 of FIG. 4 may show a structure in which a plurality of semiconductor devices 11-1 and 11-2 shown in FIG. 3 are stacked, one on top of the other.

Referring to FIGS. 3 and 4, the semiconductor device 12 shown in FIG. 4 may include a structure in which an upper semiconductor device 11-2 is substantially vertically stacked on a lower semiconductor device 11-1. The upper semiconductor device 11-2 may be coupled to the lower semiconductor device 11-1 such that an upper bump 510-2 of the upper semiconductor device 11-2 is coupled to a lower bump 530-1 of the lower semiconductor device 11-1. The lower semiconductor device 11-1 may have substantially the same configuration as the semiconductor device 11 described with reference to FIG. 3. The upper semiconductor device 11-2 may also have substantially the same configuration as the semiconductor device 11 described with reference to FIG. 3. The lower bump 530-1 of the lower semiconductor device 11-1 may have substantially the same configuration as the third bump 530 of the semiconductor device 11 of FIG. 3. The upper bump 510-2 of the upper semiconductor device 11-2 may have substantially the same configuration as the first bump 510 of the semiconductor device 11 of FIG. 3.

Figure 5:
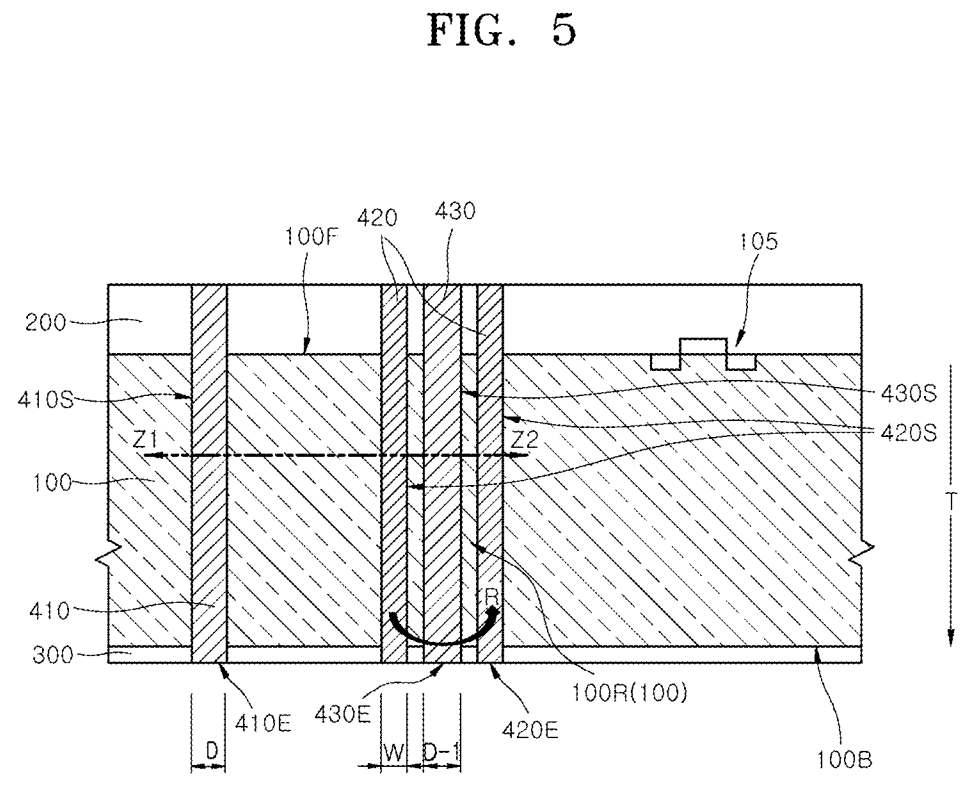
Figure 6:
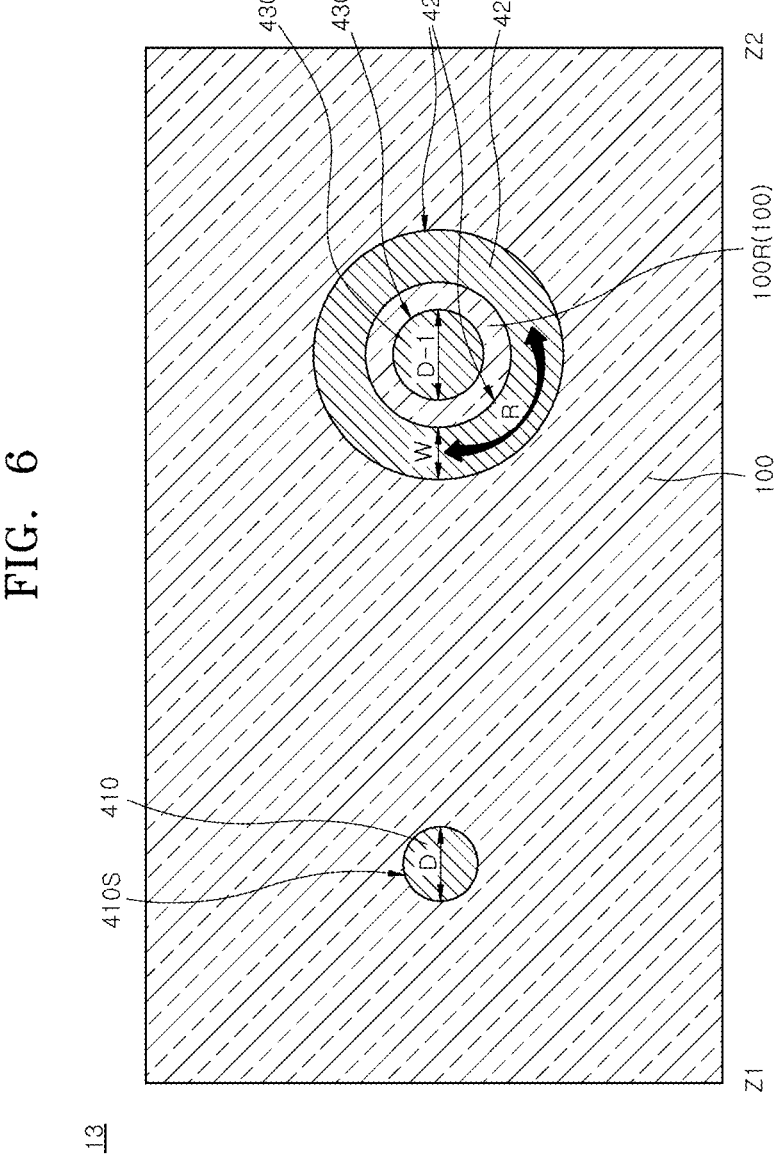

FIG. 5 is a schematic vertical cross-sectional view illustrating a semiconductor device 13 according to another embodiment. FIG. 6 is a schematic horizontal cross-sectional view of the semiconductor device 13 taken along line Z1-Z2 of FIG. 5. It may be understood that the same reference numerals in FIGS. 5 and 6 as in FIGS. 1 and 2 denote the same elements.

Referring to FIGS. 5 and 6, the semiconductor device 13 may further include a third, tube-shaped through via 430, in addition to the first through via 410 and the second through via 420, all three of which are formed in the substrate 100 of the semiconductor device 10 illustrated in FIGS. 1 and 2. The first through via 410, the second through via 420, and the third through via 430 may each include a conductive layer, a conductive pattern, or a conductive element that penetrates the substrate 100. Although not illustrated, each of the first through via 410, the second through via 420, and the third through via 430 may include an insulating layer or a buffer layer that electrically isolates the conductive layer (conductive pattern, or conductive element) from the substrate 100.

The first through via 410, the second through via 420, and the third through via 430 may be formed to extend from the first surface 100F to the second surface 100B of the substrate 100, and to substantially penetrate the substrate 100. Each of the first through via 410, the second through via 420, and the third through via 430 may have a shape extending in the direction "T" which is downwardly from the first surface 100F and toward the second surface 100B of the substrate 100. Each of the first through via 410, the second through via

420, and the third through via 430 may be formed to provide substantially vertically-oriented electrical interconnection path through the substrate 100. Each of the first through via 410, the second through via 420, and the third through via 430 may be formed to have a through silicon via (TSV) structure or a through substrate via structure.

The first through via 410 may have a shape of a pillar that penetrates the substrate 100. The second through via 420 may have a shape of a tube, the horizontal cross-sectional shape of which is a ring or annulus. The second through-via also penetrates the substrate 100. The third through via 430 may be formed to penetrate the substrate 100 while being positioned on an inner side of the first ring shape of the second through via 420. The third through via 430 may also have a pillar shape and which extends through the substrate 100 is the direction T.

As shown in FIG. 6, and illustrated by the cross-section taken along the cutting line Z1-Z2, the cross-sectional shape of the third through via 430 may be a circular shape. In alternate embodiments, the third through via 430 may be formed as a triangular pillar or a polygonal pillar.

Because the second, tube-shaped through via 420 has a ring shaped cross section and because the third through via 430 is positioned inside the first ring shaped cross section, a tube-shaped portion 100R of substrate 100 may confine a pillar-shaped "layer" between the tube-shaped second through via 420 and the third, pillar-shaped through via 430. The tube-shaped portion 100R of the substrate 100 may be positioned between the second through via 420 and the third through via 430.

The first through via 410, the second through via 420, and the third through via 430 may be formed such that an area of a first interface 410S between the first through via 410 and the substrate 100 is smaller than the sum of an area of a second interface 420S between the second through via 420 and the substrate 100 and an area of a third interface 430S between the third through via 430 and the substrate 100. Because the first ring shape of the second through via 420 is extended in the circumferential direction R and the third through via 430 is positioned on the inner side of the second through via 420, the sum of the area of the second interface 420S and the area of the third interface 430S may be greater than the area of the first interface 410S between the first through via 410 and the substrate 100. Accordingly, a first capacitance that may accompany the first through via 410 may be smaller than a second capacitance that may accompany the second and third through vias 420 and 430. The first through via 410 may be used as a path for transmitting data signals to the integrated circuit element 105, and the second and third through vias 420 and 430 may together constitute a path for transmitting power required for the operation of the integrated circuit element 105.

A wall thickness, W, of the second, tube-shaped through via 420 may be smaller than a diameter, D, of the first through via 410. A diameter, D−1, of the third. pillar-shaped through via 430 may be smaller than the diameter, D, of the first, pillar-shaped through via 410. Nevertheless, the sum of the volume of the second through via 420 and the volume of the third pillar shape of the third through via 430 may be greater than the volume of the first through via 410. In a cross-section along the Z1-Z2 cutting line, the sum of a second cross-sectional area of the second through via 420 and a third cross-sectional area of the third through via 430 may be greater than a first cross-sectional area of the first through via 410.

When the second through via 420 and the third through via 430 are commonly grouped to form one common via, a third resistance accompanying the common vias 420 and 430 may be smaller than a first resistance accompanying the first through via 410. The common vias 420 and 430 may therefore be better-suited to transmit power for integrated circuit elements 105 than the first through via 410. By using the common vias 420 and 430 as the power transmission path, the power distribution network (PDN) characteristics of the semiconductor device 13 may be improved.

Figure 7:
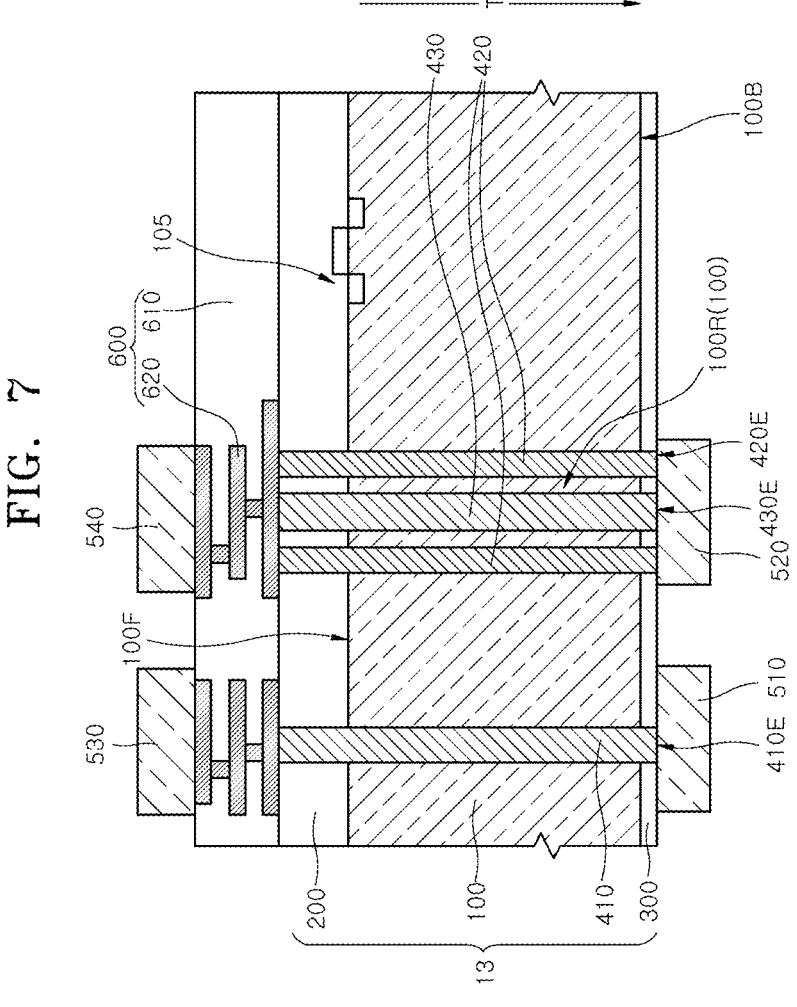
FIGS. 7 and 8 are schematic views illustrating semiconductor devices according to embodiments of the present disclosure.

FIG. 7 is a schematic vertical cross-sectional view illustrating a semiconductor device 14 according to an embodiment of the present disclosure, and illustrating a structure in which bumps 510, 520, 530, and 540 are connected to the semiconductor device 13 of FIG. 5. In FIG. 7, it may be understood that the same reference numerals as in FIGS. 1, 2, 5, and 6 indicate substantially the same elements.

Referring to FIGS. 5 and 7, the semiconductor device 14 may further include a first bump 510 and a second bump 520, compared to the semiconductor device 13 of FIG. 5. The first bump 510 may be a connector that is positioned over a second surface 100B of the substrate 100 and electrically connected to a first through via 410. The second bump 520 may be a connector that is positioned over the second surface 100B of the substrate 100 and electrically common to a second through via 420 and a third through via 430 connected together. The second through via 420 and the third through via 430 are connected together to the second bump 520. Accordingly, the second through via 420 and the third through via 430 may act as one common via 420 and 430.

The semiconductor device 14 may further include a third bump 530 and a fourth bump 540 over a first surface 100F of the substrate 100. The third bump 530 may be one of a variety of connectors that are electrically connected to the first through via 410, while being opposed to the first bump 510. The fourth bump 540 may be one of a variety of connectors that connect the second through via 420 and the third through via 430 in common while being opposed to the second bump 520.

The semiconductor device 14 may further include an interconnection structure 600, which may be positioned between the third bump 530 and the first through via 410 or between the fourth bump 540 and the second through via 420. The interconnection structure 600 may include a second dielectric layer 610 and interconnection patterns 620. The second dielectric layer 610 may insulate the interconnection patterns 620 from each other. Because the rest of the components are substantially the same as those illustrated in FIGS. 1, 2, 5, and 6, duplicate descriptions omitted in the interest of brevity.

Figure 8:
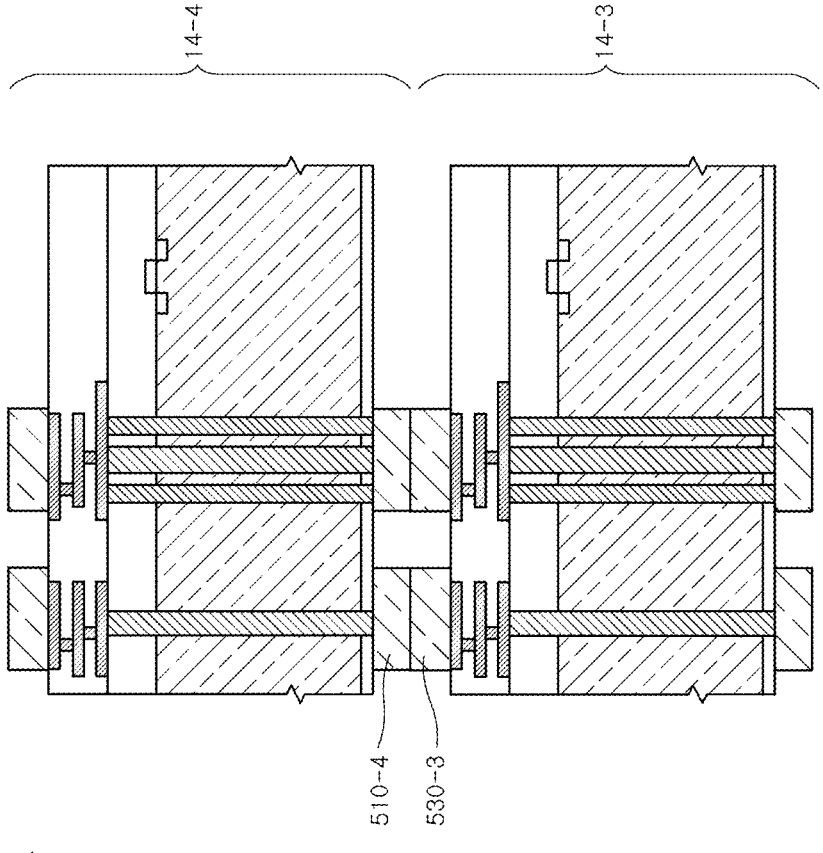

FIG. 8 is a schematic vertical cross-sectional view illustrating a semiconductor device 15 according to an embodiment. FIG. 8 may illustrate a structure in which a plurality of semiconductor devices 14 of FIG. 7 are stacked.

Referring to FIGS. 7 and 8, the semiconductor device 15 may include a structure in which an upper semiconductor device 14-4 is substantially vertically stacked on a lower semiconductor device 14-3. The upper semiconductor device 14-4 may be coupled or bonded to a lower bump 530-3 of the lower semiconductor device 14-3 such that an upper bump 510-4 of the upper semiconductor device 14-4 is coupled or bonded to the lower bump 530-3 of the lower semiconductor device 14-3. The lower semiconductor device 14-3 may have substantially the same configuration as the semiconductor device 14 described with reference to FIG. 7. The upper semiconductor device 14-4 may also have substantially the same configuration as the semiconductor device 14 described with reference to FIG. 7. The lower bump 530-3 of the lower semiconductor device 14-3 may have substantially the same configuration as the third bump 530 of the semiconductor device 14 of FIG. 7. The upper bump 510-4 of the upper semiconductor device 14-4 may have substantially the same configuration as the first bump 510 of the semiconductor device 14 of FIG. 7.

FIGS. 9 to 17 are schematic views, each figure illustrating one or more steps of a method of manufacturing a semiconductor device according to an embodiment of the present disclosure. The semiconductor devices 10 and 11 of FIGS. 1 and 3 may be implemented by the method of manufacturing the semiconductor device illustrated in FIGS. 9 to 17. In FIGS. 9 to 17, the same reference numerals as in FIGS. 1 and 3 may indicate substantially the same elements.

Figure 9:
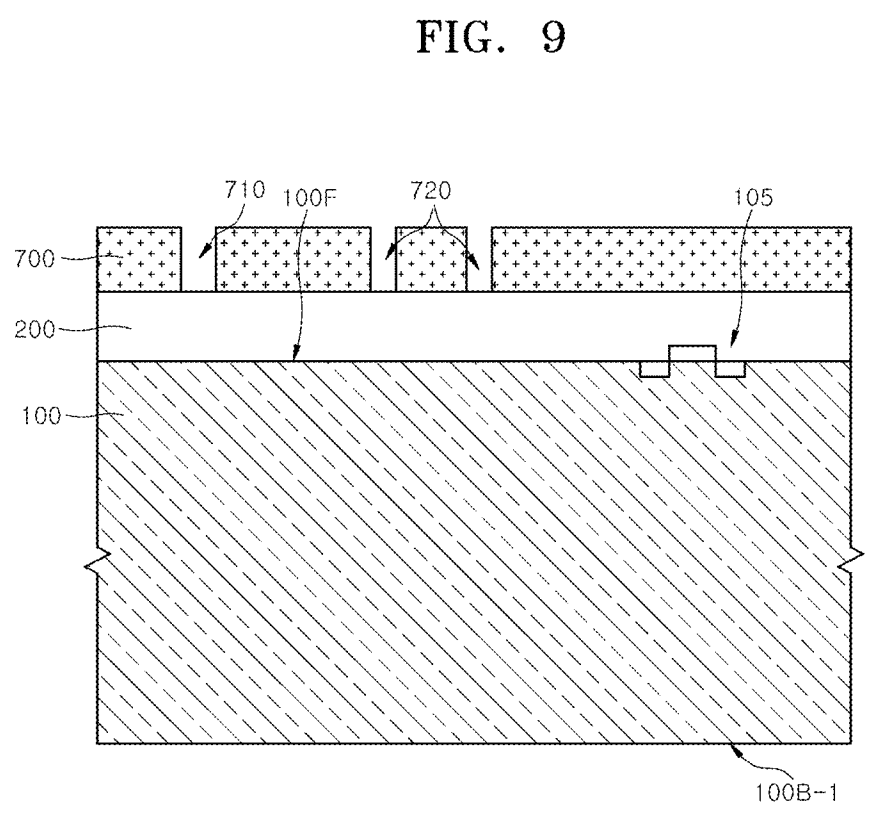

Referring to FIG. 9, a first dielectric layer 200 may be formed on a substrate 100. The substrate 100 may have a first surface 100F and a second surface 100B-1 which are opposite to each other. Integrated circuit elements 105 may be formed on the first surface 100F of the substrate 100. The integrated circuit elements 105 may be formed on the substrate 100 by performing semiconductor processes such as oxidation, diffusion, or ion implantation with respect to the substrate 100. The first dielectric layer 200 may be formed as an insulating layer covering the integrated circuit elements 105. The first dielectric layer 200 may include silicon dioxide ($SiO_2$), silicon nitride ($Si_3N_4$), silicon oxynitride (SiON), or a composite layer thereof.

An etch mask 700 may be formed over the first surface 100F. The etch mask 700 may include a photoresist pattern. The photoresist pattern may be formed by performing a photo-lithography process on the first dielectric layer 200. Specifically, a photoresist layer may be formed on the first dielectric layer 200, and may be exposed and developed to form the photoresist pattern. The etch mask 700 may further include a hard mask that is patterned by the photoresist pattern. The hard mask may include various dielectric materials other than photoresist materials. The hard mask may include a dielectric material such as silicon dioxide, silicon nitride, or amorphous carbon. The etch mask 700 may be formed on the first dielectric layer 200, but in some cases, various material layers may be interposed between the first dielectric layer 200 and the etch mask 700.

The etch mask 700 may be a pattern that provides a first opening 710 and a second opening 720 exposing some portions of the first dielectric layer 200 as a lower layer. The first opening 710 and the second opening 720 may be formed to have various shapes. The first opening 710 and the second opening 720 may be positioned at positions where through vias are to be formed. The first opening 710 may have a circular hole shape. The second opening 720 may have a ring-type hole shape.

Figure 10:
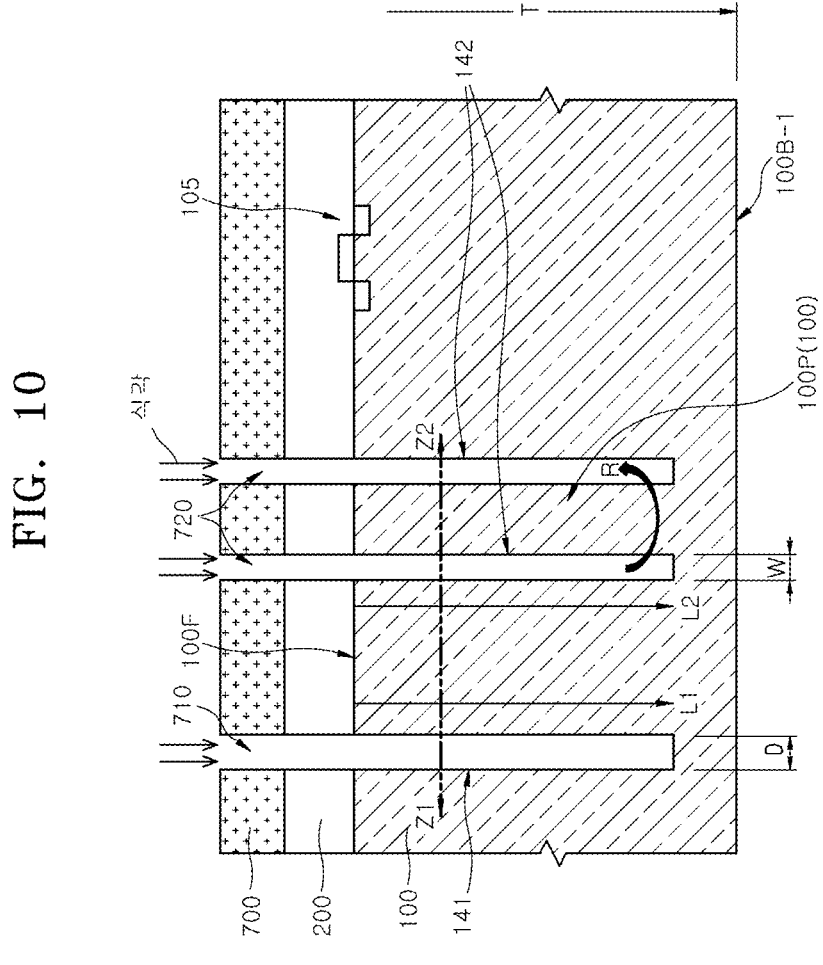
Figure 11:
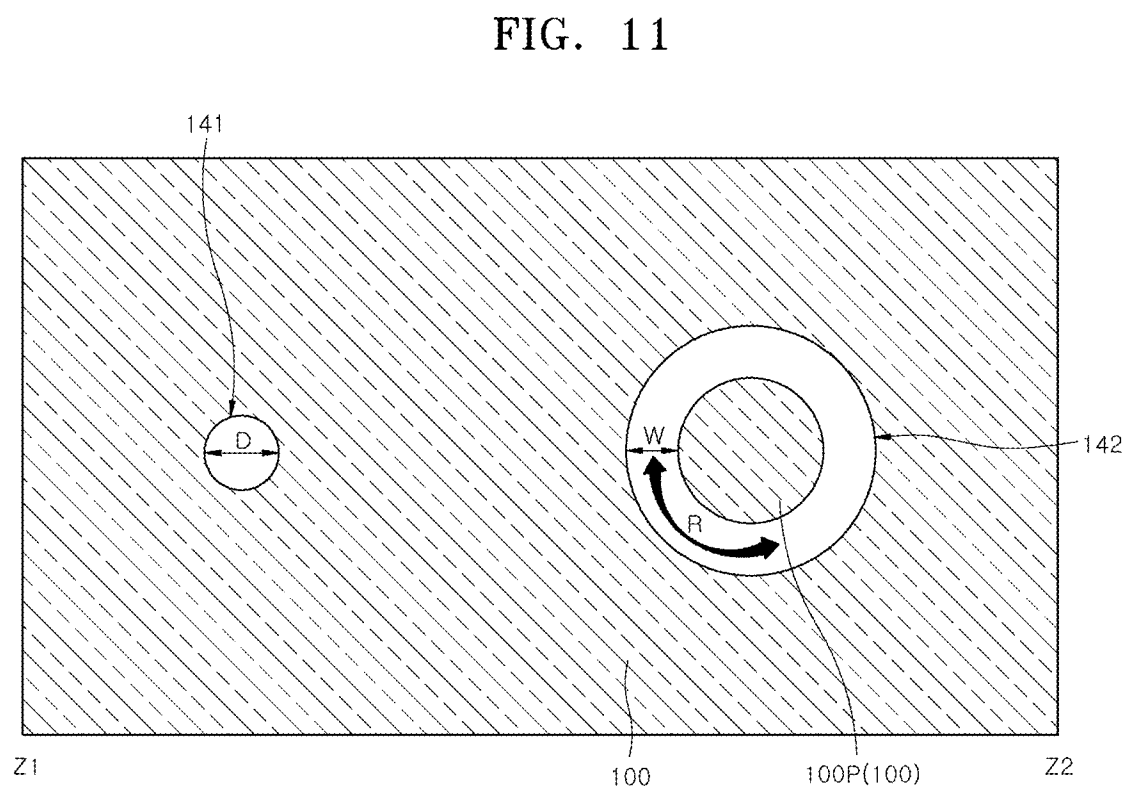

Referring to FIGS. 10 and 11, first and second elongated holes identified by reference numerals 141 and 142, may be formed in the first surface 100F of the substrate 100. FIG. 11 may illustrate a cross-section of the substrate 100 along a cutting line Z1-Z2 of FIG. 10. Some portions of the first dielectric layer 200 exposed by the first and second openings 710 and 720 of the etch mask 700 may be selectively etched and removed, and subsequently, exposed portions of the first surface 100F of the substrate 100 may be selectively etched and removed. Accordingly, the first and second holes or holes 141 and 142 following the shapes of the first and second openings 710 and 720 of the etch mask 700 may be formed in the substrate 100.

The first hole 141 may be formed such that when it is filled, it provides a pillar-shaped via such as the first through via 410 illustrated in FIGS. 1 and 2. The first hole 141 may be formed as a first hole having substantially the same diameter, D, as the first through via 410. The second hole 142 may be formed such that when it is filled, it provides a tube-shaped via having the shape of the second through via 420 illustrated in FIGS. 1 and 2. As shown in FIG. 11, the horizontal cross section of the second hole 142 is ring shaped. The second hole 142 may be formed as a second hole having substantially the same width, W, as the corresponding width of second through via 420 and extending in substantially the same circumferential direction R as the second through via 420. As the second hole 142 is formed as the first ring shape, a portion 100P of the substrate 100 may have a pillar shape surrounded by the second hole 142.

Although the first hole 141 and the second hole 142 have different shapes, the first hole 141 and the second hole 142 may be formed such that a first depth L1 of the first hole 141 is similar to or substantially the same as a second depth L2 of the second hole 142. The first hole 141 and the second hole 142 may be formed such that a section width, W, of the second hole 142 in a direction that is perpendicular to the circumferential direction R of the first ring shape and a through direction T penetrating the substrate 100 is to be smaller than a diameter D of the first hole 141.

The second hole of the first ring shape of the second hole 142 may have the section width, W, less than or narrower than the diameter, D, of the first hole of the first pillar shape of the first hole 141. Accordingly, although the second hole of the first ring shape of the second hole 142 extends in the circumferential direction R, the first hole 141 and the second hole 142 may be formed to have substantially the same depths L1 and L2. As the length of the second hole of the first ring shape of the second hole 142, extending in the circumferential direction R increases, the section width, W, of the second hole of the first ring shape of the second hole 142 decreases, and thus, the first hole 141 and the second hole 142 may be induced to be formed to have substantially the same depths L1 and L2.

When the first hole 141 and the second hole 142 are formed at different depths L1 and L2, the lengths of the through vias to fill the first hole 141 and the second hole 142 may be different. As illustrated in FIG. 1, the first through via 410 and the second through via 420 need to have the same length as the thickness of the substrate 100, an additional process of equalizing the lengths of the through vias having various lengths may be required. Because the first hole 141 and the second hole 142 may be formed to have substantially the same depths L1 and L2, an additional process of equalizing the lengths of the through vias may be omitted.

While forming the first hole 141 and the second hole 142 to have substantially the same depths L1 and L2 in the through direction T of the substrate 100, a second volume of the second hole of the first ring shape of the second hole 142 may be greater than a first volume of the first hole of the first pillar shape of the first hole 141. Accordingly, as described above with reference to FIG. 1, the second through via 420 to be formed while filling the second hole 142 may have a lower resistance than the first through via 410 to be formed while filling the first hole 141. In addition, an area of a first interface 410S between the first through via 410 and the substrate 100 may be induced to be smaller than an area of a second interface 420S between the second through via 420 and the substrate 100. Accordingly, the loss of a data signal to be transmitted through the first through via 410 may be reduced compared to a case where the data signal is transmitted through the second through via 420.

Figure 12:
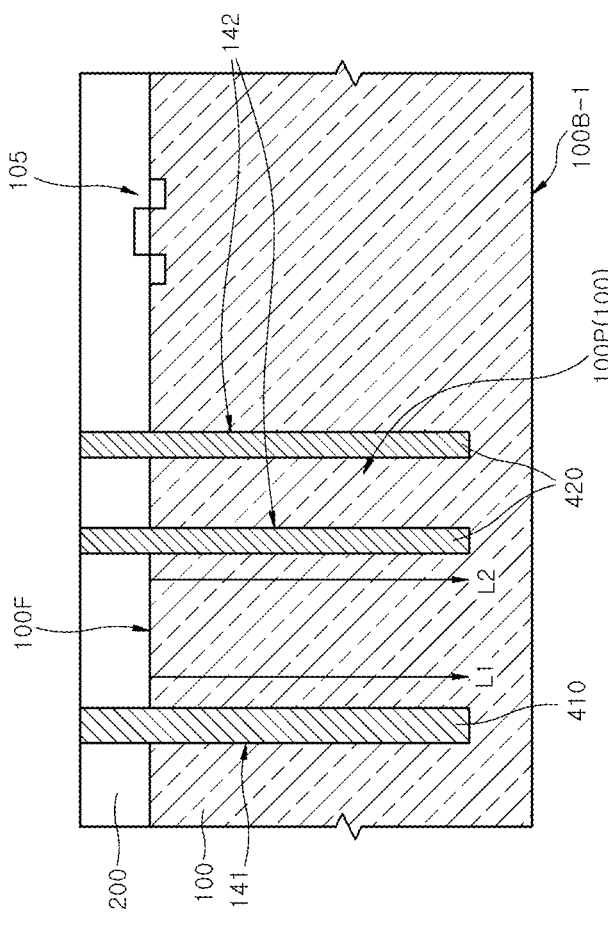

Referring to FIG. 12, the first through via 410 and the second through via 420 may be formed to fill the first hole 141 and the second hole 142, respectively. The first through via 410 and the second through via 420 may be formed by forming an insulating layer (not shown) or a buffer layer (not shown) in the first hole 141 and the second hole 142 and performing a plating process.

Figure 13:
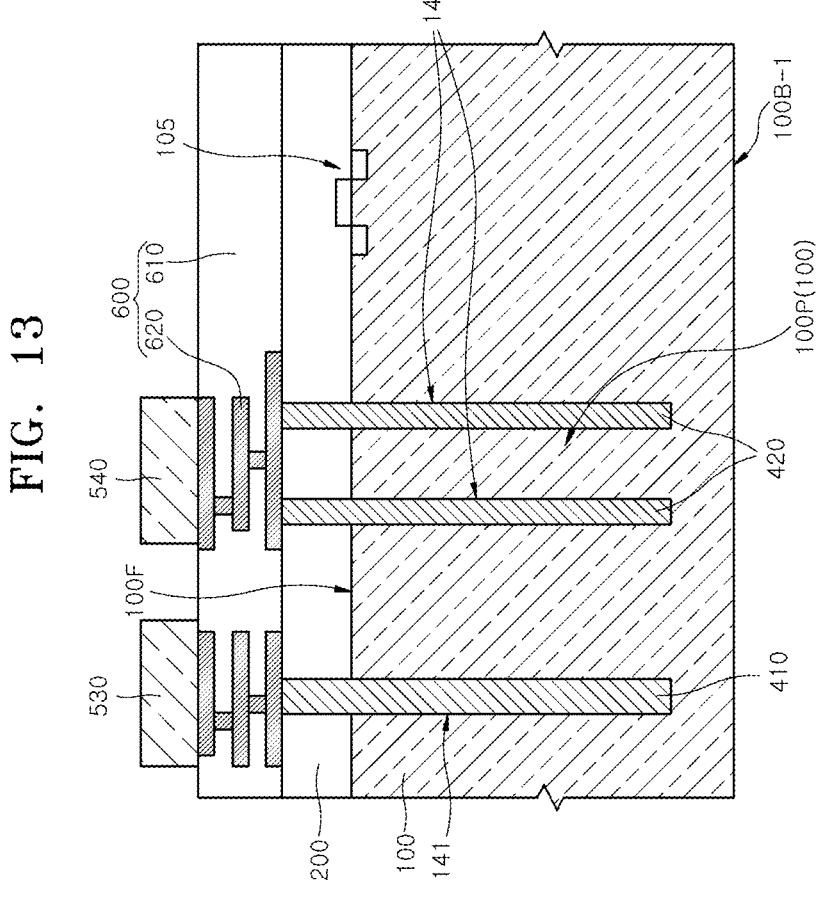

Referring to FIG. 13, an interconnection structure 600 may be formed on the first dielectric layer 200, and a third bump 530 and a fourth bump 540 may be formed on the interconnection structure 600. The interconnection structure 600 may include a second dielectric layer 610 and interconnection patterns 620.

Figure 14:
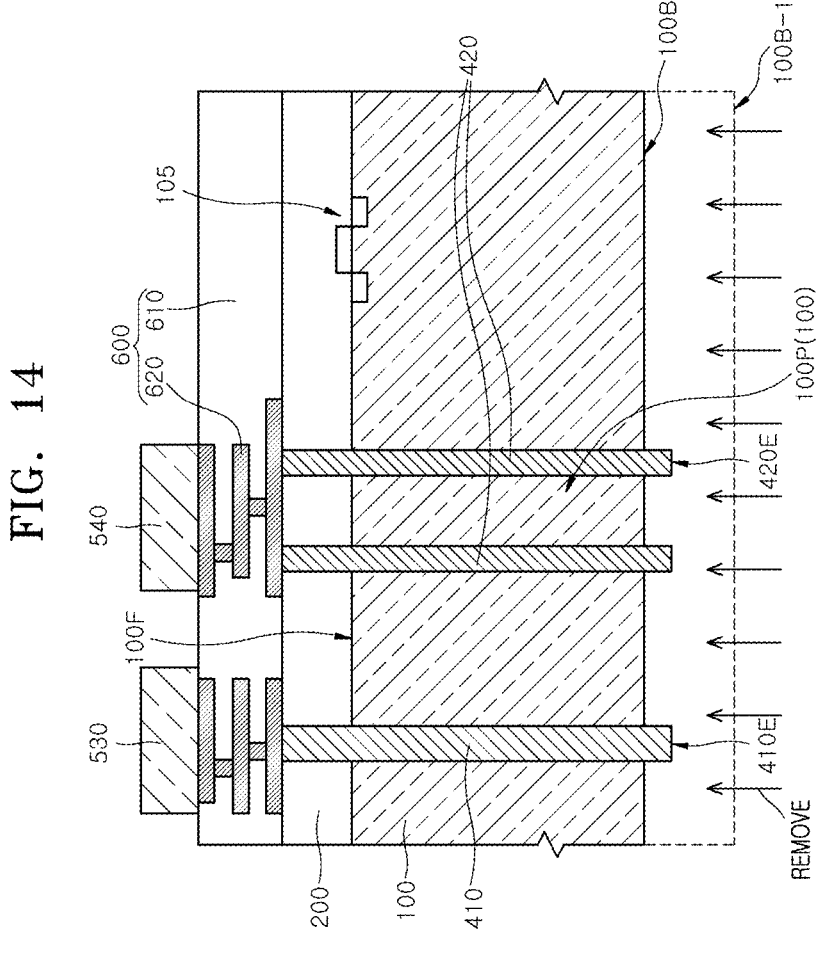

Referring to FIG. 14, which is a vertical cross section, a portion of the substrate 100 (as indicated with the arrows labeled with "REMOVE" in FIG. 14) may be removed from the second surface 100B-1 that is opposite to the first surface 100F of the substrate 100. Accordingly, an end 410E of the first through via 410 and an end 420E of the second through via 420 may be exposed from the second surface 100B.

Figure 15:
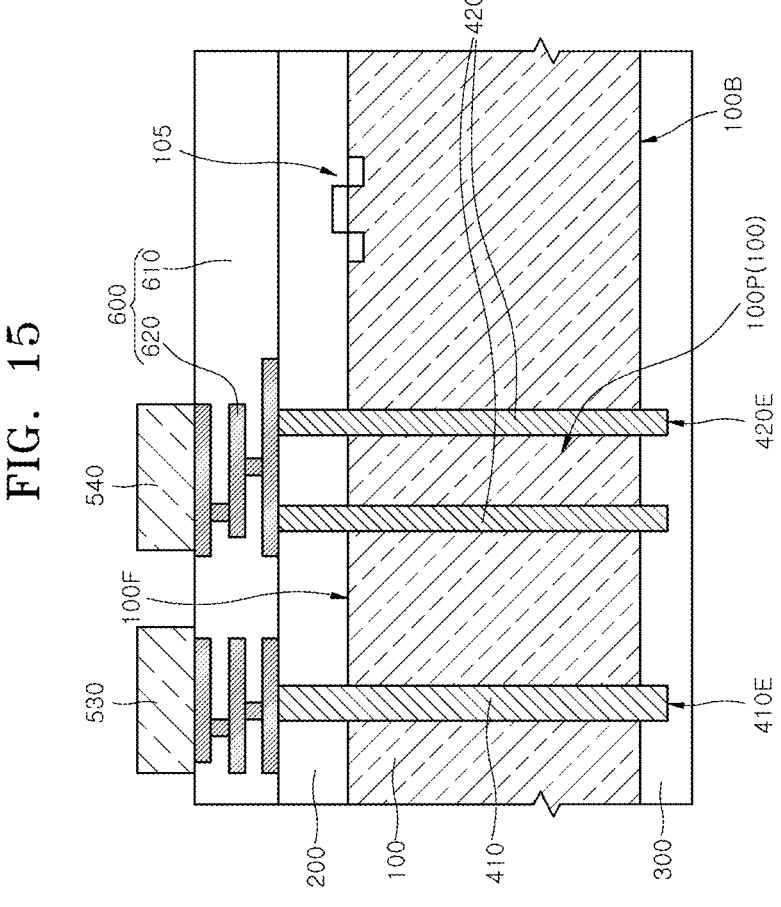

Referring to FIG. 15, also a vertical cross section, a protection layer 300 covering the second surface 100B of the substrate 100 may be formed. The protection layer 300 may extend to cover the ends 410E and 420E of the first and second through vias 410 and 420.

Figure 16:
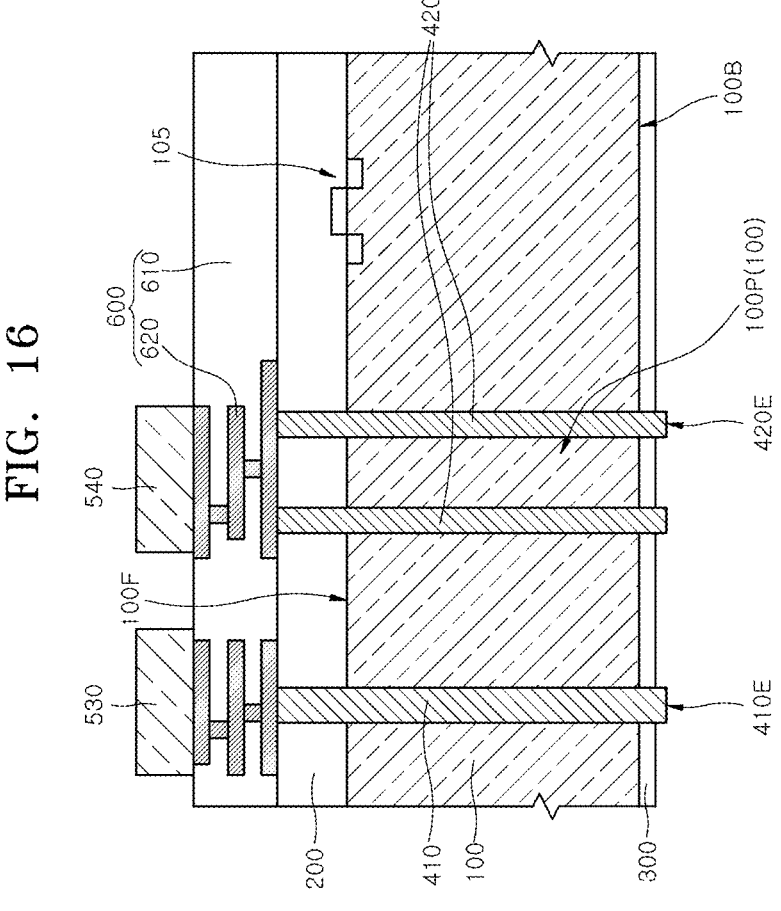

Referring to FIG. 16, a portion of the protection layer 300 may be removed to expose the ends 410E and 420E of the first and second through vias 410 and 420 again. The portion of the protection layer 300 may be removed using a planarization process such as chemical mechanical polishing (CMP).

Figure 17:
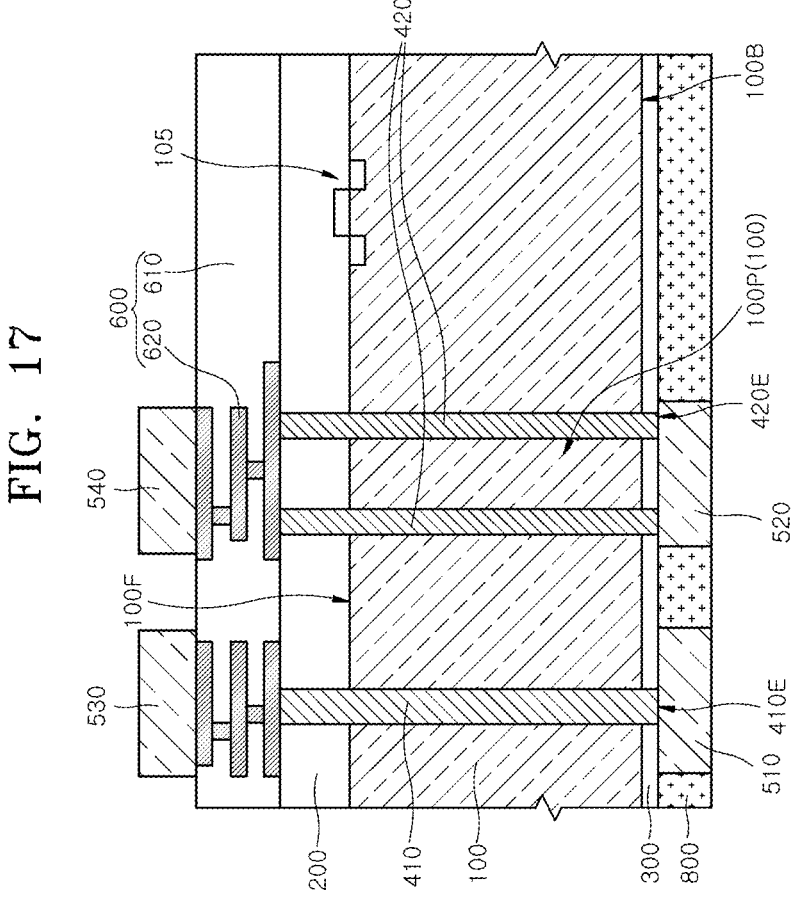

Referring to FIG. 17, a first bump 510 and a second bump 520 may be formed to be respectively connected to the ends 410E and 420E of the first and second through vias 410 and 420. The first bump 510 and the second bump 520 may be formed through a plating process using a plating resist pattern 800.

FIGS. 18 to 22 are schematic views illustrating steps of a method of manufacturing a semiconductor device according to an embodiment of the present disclosure. The semiconductor devices 13 and 14 of FIGS. 5 and 7 may be implemented by the method of manufacturing the semiconductor devices illustrated in FIGS. 18 to 22. In FIGS. 18 to 22, the same reference numerals as those in FIGS. 5 and 7 may indicate substantially the same elements. In addition, in FIGS. 18 to 22, the same reference numerals as those in FIGS. 9 and 17 may indicate substantially the same elements.

Figure 18:
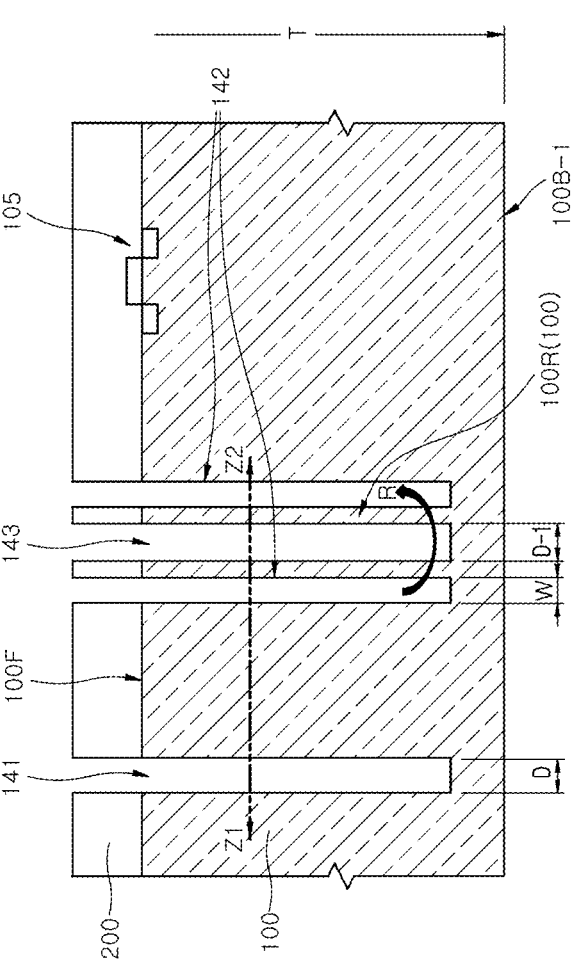
Figure 19:
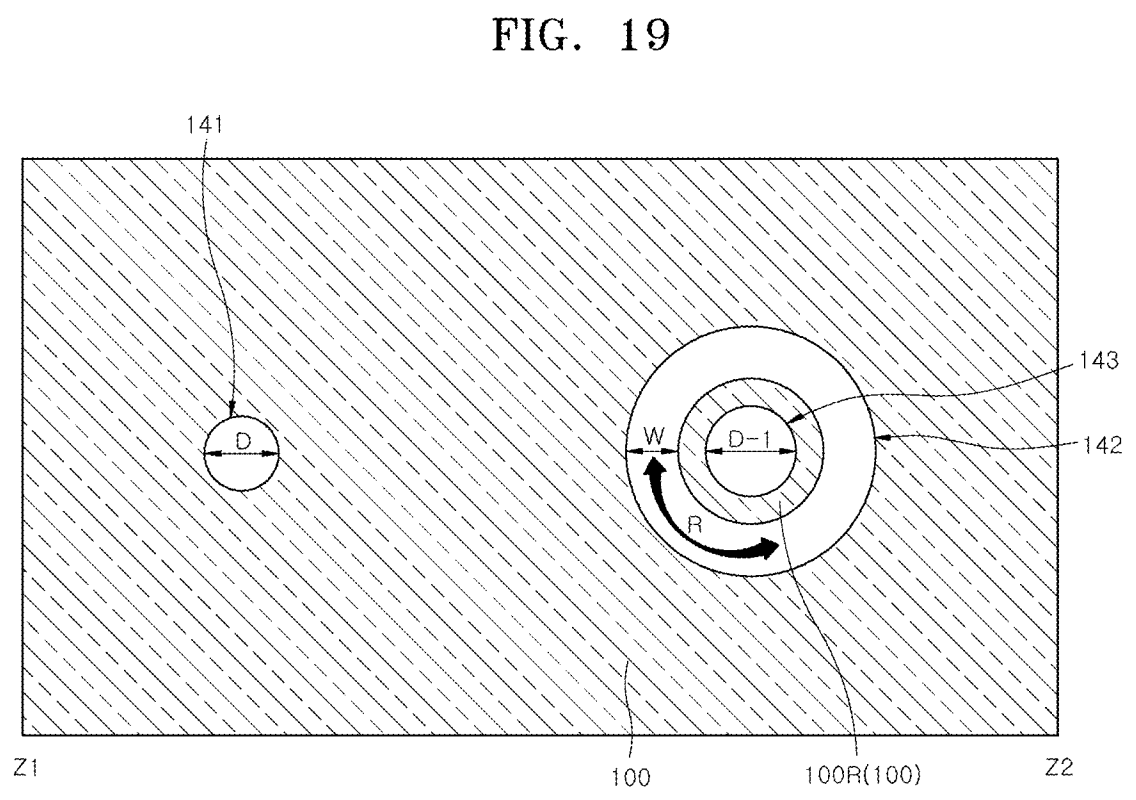

Referring to FIGS. 18 and 19, a third hole 143 may be formed together with first and second holes 141 and 142 in a first surface 100F of a substrate 100. FIG. 19, which is a horizontal cross section, may show a shape of a cross-section of the substrate 100 along a cutting line Z1-Z2 of FIG. 18. The third hole 143 may be positioned on the inner side of the first ring shape of the second hole 142. The third hole 143 may be formed in a shape to be filled with the third through via 430 illustrated in FIGS. 5 and 6. The third hole 143 may be formed as a third hole of a third pillar shape having substantially the same diameter D-1 as the third through via 430. A portion 100R of the substrate 100 may be positioned between the second hole 142 and the third hole 143 and may have a second ring shape. The first, second, and third holes 141, 142, and 143 may have various different or similar horizontal cross-sectional shapes, but may have substantially the same depths.

Figure 20:
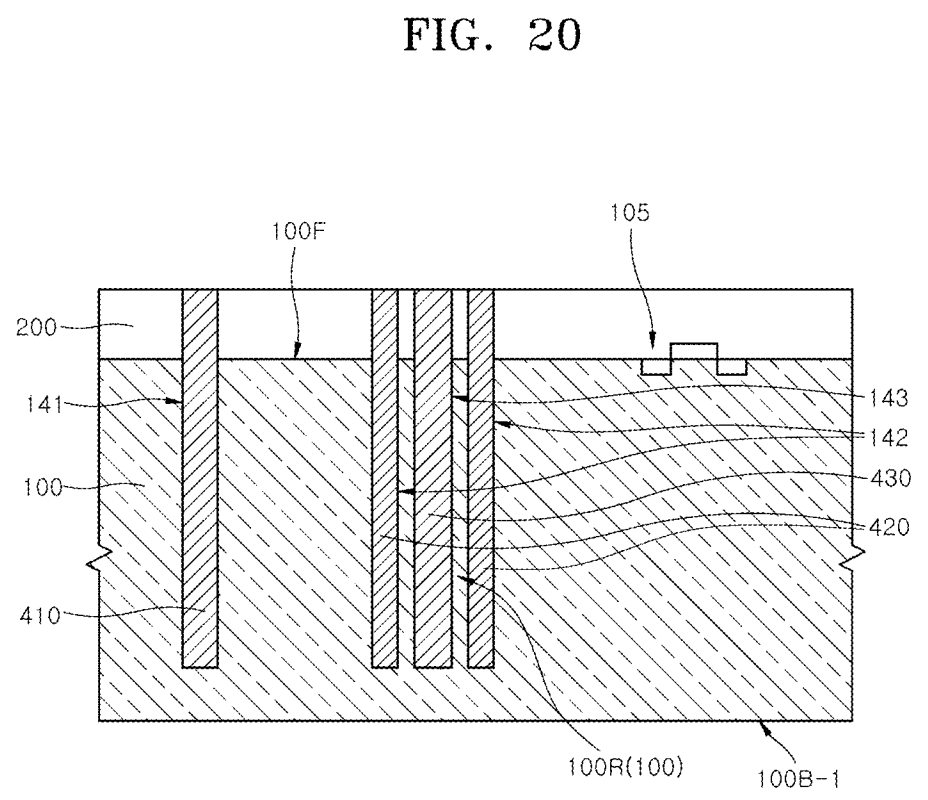

Referring to FIG. 20, first, second, and third through vias 410, 420, and 430 may be formed to fill the first hole 141, the second hole 142, and the third hole 143, respectively. The third through via 430 filling the third hole 143 may be formed together with the first and second through vias 410 and 420.

Figure 21:
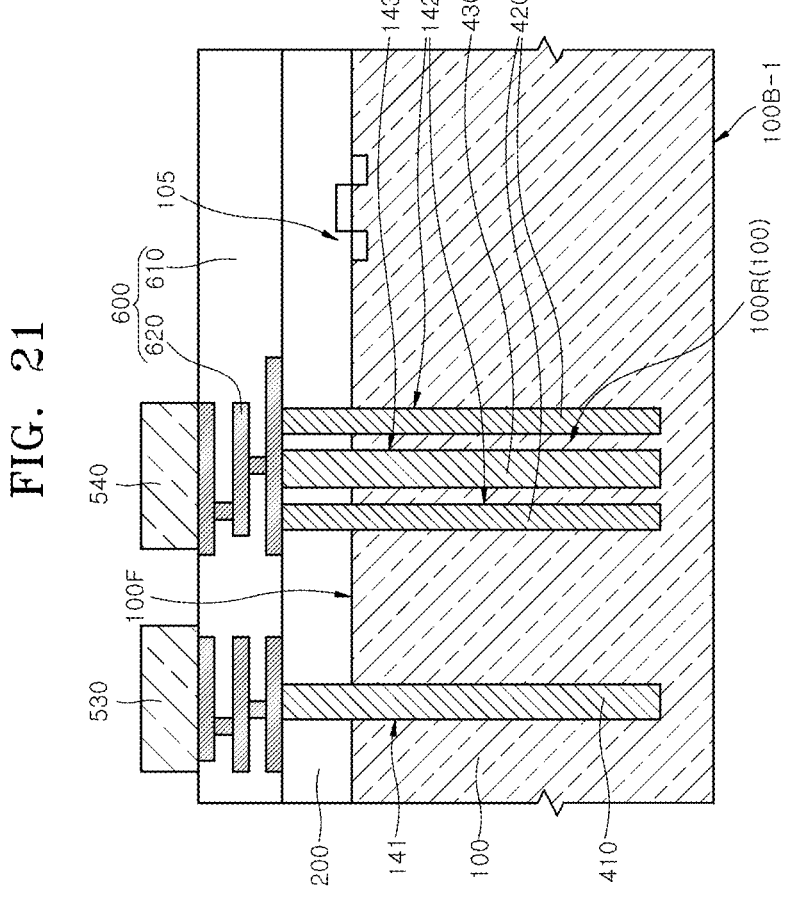

Referring to FIG. 21, an interconnection structure 600 may be formed on a first dielectric layer 200, and a third bump 530 and a fourth bump 540 may be formed on the interconnection structure 600. The interconnection structure 600 may include a second dielectric layer 610 and interconnection patterns 620.

Figure 22:
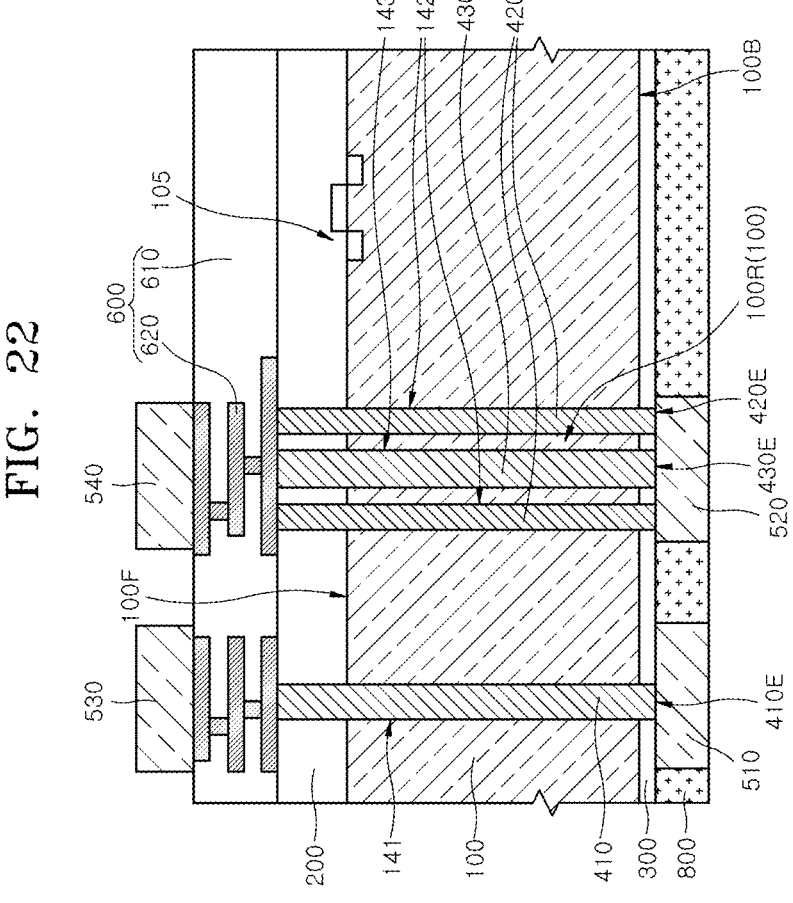

Referring to FIGS. 21 and 22, a portion of the substrate 100 may be removed from a second surface 100B-1 opposite to the first surface 100F of the substrate 100. Accordingly, an end 410E of the first through via 410, an end 420E of the second through via 420, and an end 430E of the third through via 430 may be exposed from the recessed second surface 100B. A protection layer 300 may be formed to cover the second surface 100B. A first bump 510 connected to the end 410E of the first through via 410 exposed on the protective layer 300 may be formed. A second bump 520 connected to the ends 420E and 430E of the second and third through vias 420 and 430 may be formed. The first bump 510 and the second bump 520 may be formed by a plating process using a plating resist pattern 800.

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A semiconductor device comprising:
a substrate;
a first through via and a second through via which penetrate the substrate;
a third through via inside of the second through via, the third through via penetrating the substrate;
a first bump connected to the first through via; and
a second bump to which the second and third through vias are both connected,
wherein the first through via is substantially pillar-shaped; and
wherein the second through via is substantially tube-shaped.

2. The semiconductor device of claim 1, wherein a portion of the substrate has a pillar-shaped portion surrounded by the tube-shaped second through via.

3. The semiconductor device of claim 1, wherein the first through via and the second through via are electrically conductive and comprise the same conductive material.

4. The semiconductor device of claim 1, wherein an area of an interface between the first through via and substrate material surrounding the first through via, is less than an area of an interface between the second through via and substrate material surrounding the second through via.

5. The semiconductor device of claim 1, wherein a wall thickness of the tube-shaped second through via is smaller than a diameter of the first, pillar-shaped through via.

6. The semiconductor device of claim 1, wherein substrate material is between the tube-shaped second through via and the third, pillar-shaped through via.

7. The semiconductor device of claim 1, wherein the third through via is substantially pillar-shaped.

8. The semiconductor device of claim 1, wherein an area of an interface between the first through via substrate material surrounding the first through via is less than a sum of an area of an interface between the second through via and surrounding substrate material and an area of an interface between the third through via and the surrounding substrate material.

9. A method of manufacturing a semiconductor device, the method comprising:
forming first and second holes in a first surface of a substrate; and
forming first and second through vias in the substrate by filling the first and the second holes with an electrically-conductive material;
wherein the first hole is a substantially circular hole having a substantially round horizontal cross-sectional shape, and wherein the filled first hole is substantially pillar-shaped; and
wherein the second hole is substantially tube-shaped, the horizontal cross section shape is substantially ring-shaped.

10. The method of claim 9, further comprising:
removing a portion of the substrate from a second surface of the substrate that is opposite the first surface of the substrate thereby exposing an end of each of the first and second through vias;
forming a protection layer on the second substrate surface, the protection layer covering exposed ends of the first and second through vias;
removing a portion of the protection layer to expose the ends of the first and second through vias again; and
forming first and second bumps connected to the ends of the first and second through vias, respectively.

11. The method of claim 9, wherein the step of forming the first and second holes is performed such that a portion of the substrate has a pillar shaped, which is surrounded by the substantially tube-shaped second hole.

12. The method of claim 9, wherein the step of forming the first hole and the second hole is performed such that a cross section width of the second through via is less than a diameter of the first through via.

13. The method of claim 9,
wherein forming the first hole and the second hole is performed such that a third hole is formed together with the first and second holes, and
wherein the third hole is formed inside the second hole.

14. The method of claim 13, wherein forming the first hole and the second hole is performed such that a substantially tube-shaped portion of the substrate is between the second hole and the third hole.

15. The method of claim 13, wherein forming the first hole and the second hole is performed such that the third hole is formed as a third hole, the interior of which is substantially tube-shaped.

16. The method of claim 13, wherein forming the first and second through vias is performed such that a third through via, is formed by filling the third hole with a conductive material.

17. The method of claim 16, further comprising forming a first bump that is connected to the first through via and a forming a second bump to which the second and third through vias are both connected.

18. The method of claim 9, wherein an area of an interface between the first through via and substrate material surrounding and contacting the first through via is less than an area of an interface between the second through via and substrate material surrounding an in contact with the second through via.

* * * * *